United States Patent
Park et al.

(10) Patent No.: US 11,155,666 B2
(45) Date of Patent: Oct. 26, 2021

(54) BLOCK COPOLYMER

(71) Applicant: LG Chem, Ltd., Seoul (KR)

(72) Inventors: No Jin Park, Daejeon (KR); Jung Keun Kim, Daejeon (KR); Je Gwon Lee, Daejeon (KR); Sung Soo Yoon, Daejeon (KR); Se Jin Ku, Daejeon (KR); Mi Sook Lee, Daejeon (KR); Eun Young Choi, Daejeon (KR); Hyung Ju Ryu, Daejeon (KR)

(73) Assignee: LG Chem, Ltd.

( * ) Notice: Subject to any disclaimer, the term of this patent is extended or adjusted under 35 U.S.C. 154(b) by 154 days.

(21) Appl. No.: 16/346,333

(22) PCT Filed: Nov. 29, 2017

(86) PCT No.: PCT/KR2017/013786
§ 371 (c)(1),
(2) Date: Apr. 30, 2019

(87) PCT Pub. No.: WO2018/101730
PCT Pub. Date: Jun. 7, 2018

(65) Prior Publication Data
US 2019/0256637 A1 Aug. 22, 2019

(30) Foreign Application Priority Data
Nov. 30, 2016 (KR) ........................ 10-2016-0162134

(51) Int. Cl.
| | | |
|---|---|---|
| *C08F 220/18* | (2006.01) | |
| *C08F 220/28* | (2006.01) | |
| *C08F 299/02* | (2006.01) | |
| *C08G 61/04* | (2006.01) | |
| *C08J 5/18* | (2006.01) | |
| *H01L 21/311* | (2006.01) | |
| *C08F 212/14* | (2006.01) | |
| *G03F 1/00* | (2012.01) | |
| *C08F 212/04* | (2006.01) | |
| *C08J 5/22* | (2006.01) | |
| *H01L 21/027* | (2006.01) | |
| *C08F 2/38* | (2006.01) | |
| *C08F 220/06* | (2006.01) | |
| *C08F 220/34* | (2006.01) | |

(52) U.S. Cl.
CPC ........ *C08F 299/024* (2013.01); *C08F 212/04* (2013.01); *C08F 212/14* (2013.01); *C08F 220/18* (2013.01); *C08F 220/28* (2013.01); *C08G 61/04* (2013.01); *C08J 5/18* (2013.01); *C08J 5/22* (2013.01); *G03F 1/00* (2013.01); *H01L 21/027* (2013.01); *H01L 21/311* (2013.01); *C08F 2/38* (2013.01); *C08F 220/06* (2013.01); *C08F 220/283* (2020.02); *C08F 220/343* (2020.02); *C08F 2438/01* (2013.01); *C08F 2438/02* (2013.01); *C08G 2261/148* (2013.01)

(58) Field of Classification Search
CPC .... C08F 220/18; C08F 220/28; C08F 220/38; C08F 299/024; C08F 293/05; C08F 293/00
See application file for complete search history.

(56) References Cited

U.S. PATENT DOCUMENTS

| | | |
|---|---|---|
| 2012/0065441 A1 | 3/2012 | Augier et al. |
| 2014/0227636 A1 | 8/2014 | Hirano et al. |
| 2014/0284392 A1 | 9/2014 | Nascimento et al. |
| 2015/0093508 A1 | 4/2015 | Nagai et al. |

FOREIGN PATENT DOCUMENTS

| | | |
|---|---|---|
| JP | S63091659 A | 4/1988 |
| JP | 2013083966 A | 5/2013 |
| KR | 20120024491 A | 3/2012 |
| KR | 20140054171 A | 5/2014 |
| KR | 20140084099 A | 7/2014 |
| KR | 20160038707 A | 4/2016 |
| TW | 201317707 A | 5/2013 |
| WO | 2013047902 A1 | 4/2013 |
| WO | 2015084123 A1 | 6/2015 |

OTHER PUBLICATIONS

Wang, J. et al. Macromolecules vol. 49 pp. 7709-7717 (Year: 2016).*
International Search Report for Application No. PCT/KR2017/013786 dated Mar. 13, 2018.
Jena, S.S et al. "Solvent-dependent Self-assembly Behaviour of Block Copolymers Having Side-chain Amino Acid and Fatty Acid Block Segments", Reactive and Functional Polymers, 2016 [Electronic publishing: Dec. 11, 2015], vol. 99, pp. 26-34.
Kumar, P. P. et al., "Stimuli Responsive Self-Assembly of 3-(Octyloxy)-3-Oxopropyl Acrylate-Co-Acrylic Acid Polymer in Aqueous Media", Journal of Surfactants and Detergents, 2016 [Electronic publishing: Mar. 23, 2016], vol. I 9, No. 3, pp. 619-626.

* cited by examiner

*Primary Examiner* — Irina S Zemel
*Assistant Examiner* — Jeffrey S Lenihan
(74) *Attorney, Agent, or Firm* — Lerner, David, Littenberg, Krumholz & Mentlik, LLP

(57) ABSTRACT

The present application may provide a block copolymer and a use thereof. The block copolymer of the present application has excellent self-assembly properties or phase separation characteristics, to which various functions to be required can also be freely imparted.

16 Claims, 4 Drawing Sheets

[Figure 1]
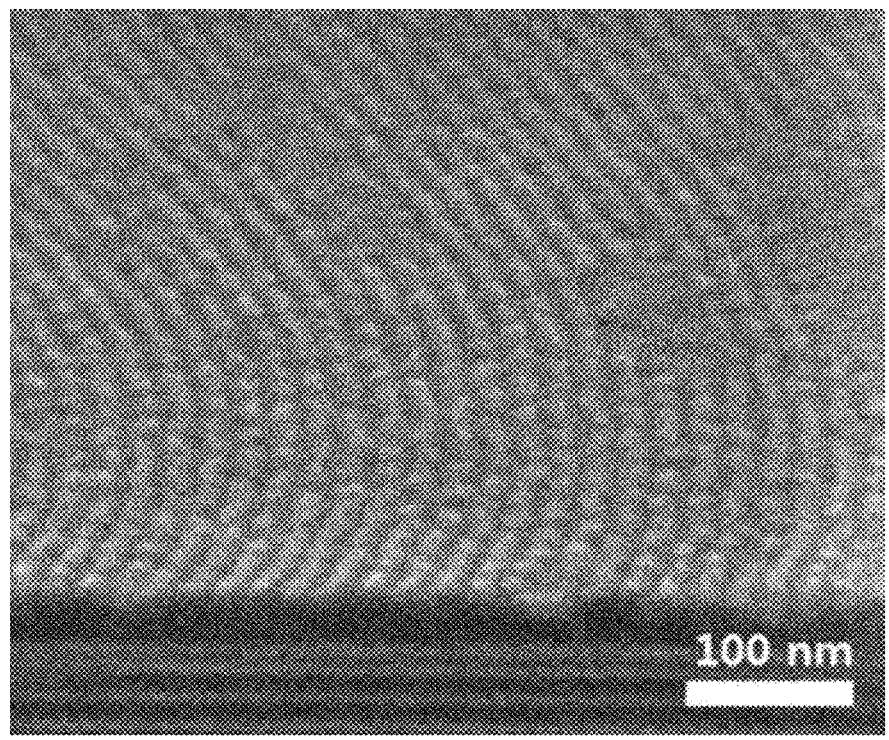

[Figure 2]
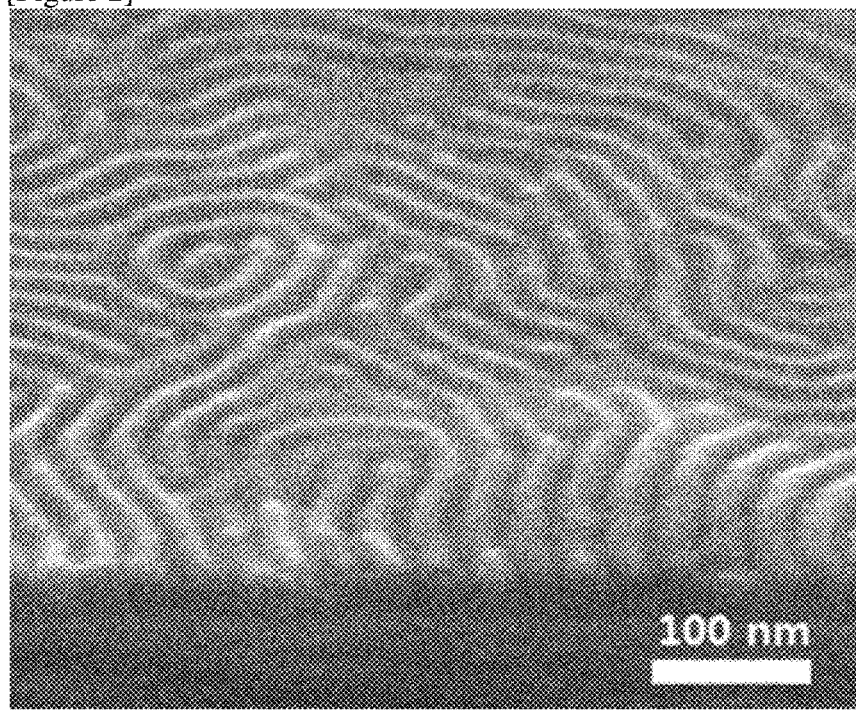

[Figure 3]
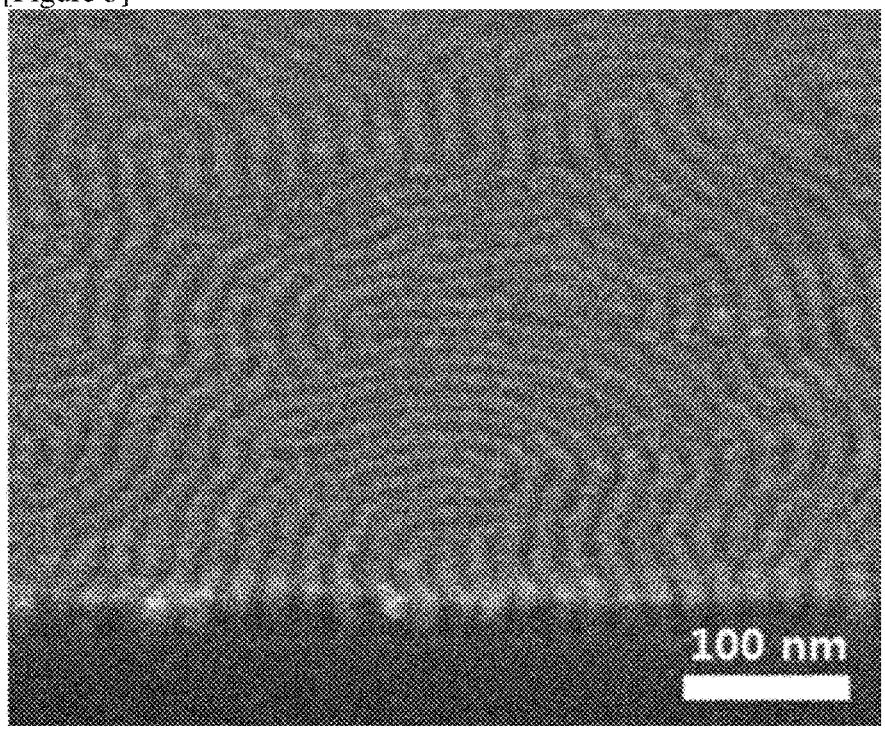
[Figure 4]
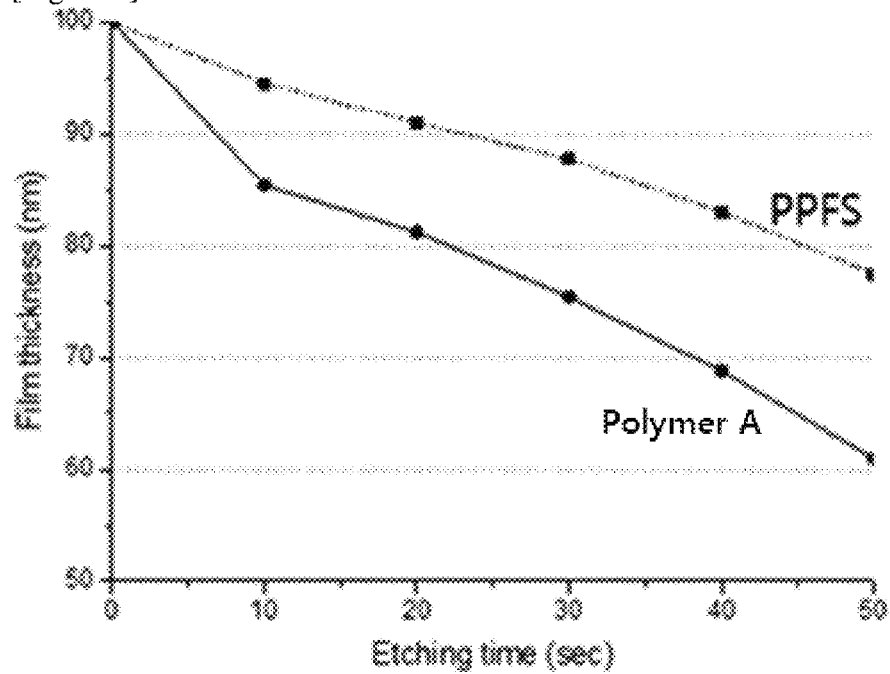

[Figure 5]
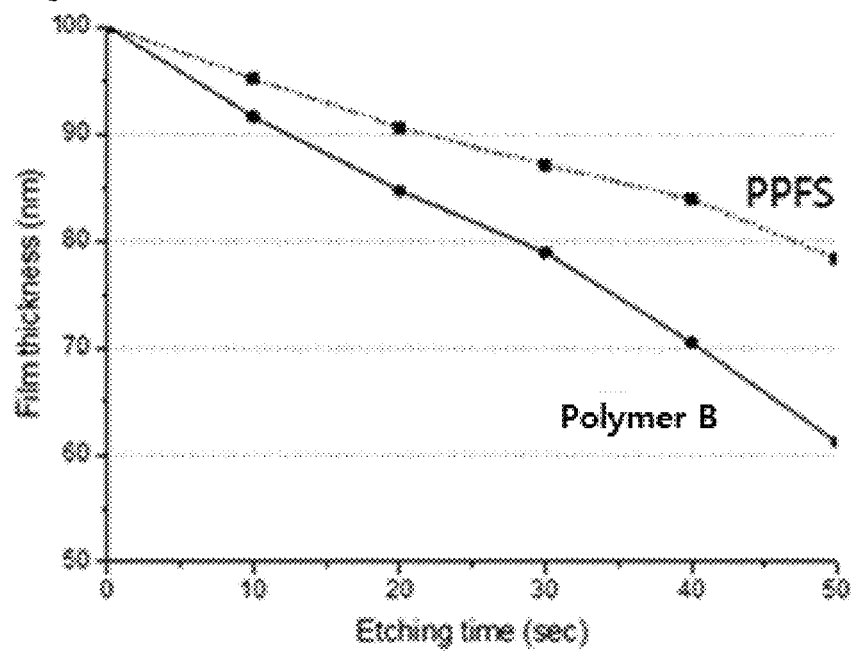
[Figure 6]
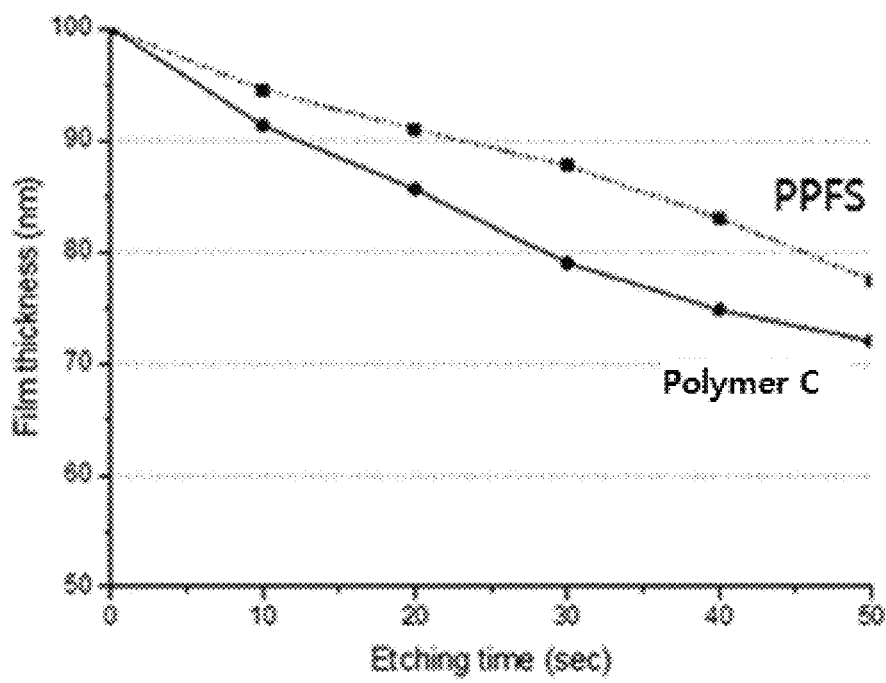

BLOCK COPOLYMER

TECHNICAL FIELD

The present application claims the benefit of priority based on Korean Patent Application No. 10-2016-0162134 filed on Nov. 30, 2016, the disclosure of which is incorporated herein by reference in its entirety.

The present application relates to a block copolymer.

BACKGROUND ART

A block copolymer has a molecular structure in which polymer segments having different chemical structures are linked via covalent bonds. The block copolymer can form a periodically arranged structure such as a sphere, a cylinder or a lamella by phase separation. The domain size of the structure formed by a self-assembly phenomenon of the block copolymer can be widely controlled and various types of structures can be manufactured, so that the block copolymer can be applied to high density magnetic storage media, nanowire fabrication, various next-generation nano devices such as quantum dots or metal dots or magnetic recording media, or pattern formation by lithography, and the like.

DISCLOSURE

Technical Problem

The present application provides a block copolymer and a use thereof.

Technical Solution

In this specification, the term alkyl group may mean an alkyl group having 1 to 20 carbon atoms, 1 to 16 carbon atoms, 1 to 12 carbon atoms, 1 to 8 carbon atoms or 1 to 4 carbon atoms, unless otherwise specified. The alkyl group may be a linear, branched or cyclic alkyl group, which may be optionally substituted with one or more substituents.

In this specification, the term alkoxy group may mean an alkoxy group having 1 to 20 carbon atoms, 1 to 16 carbon atoms, 1 to 12 carbon atoms, 1 to 8 carbon atoms or 1 to 4 carbon atoms, unless otherwise specified. The alkoxy group may be a linear, branched or cyclic alkoxy group, which may be optionally substituted with one or more substituents.

[7] The term alkenyl group or alkynyl group herein means an alkenyl group or alkynyl group having 2 to 20 carbon atoms, 2 to 16 carbon atoms, 2 to 12 carbon atoms, 2 to 8 carbon atoms or 2 to 4 carbon atoms, unless otherwise specified. The alkenyl or alkynyl group may be linear, branched or cyclic, which may be optionally substituted with one or more substituents.

The term alkylene group herein may mean an alkylene group having 1 to 20 carbon atoms, 1 to 16 carbon atoms, 1 to 12 carbon atoms, 1 to 8 carbon atoms or 1 to 4 carbon atoms, unless otherwise specified. The alkylene group may be a linear, branched or cyclic alkylene group, which may be optionally substituted with one or more substituents.

The term alkenylene group or alkynylene group herein may mean an alkenylene group or alkynylene group having 2 to 20 carbon atoms, 2 to 16 carbon atoms, 2 to 12 carbon atoms, 2 to 8 carbon atoms or 2 to 4 carbon atoms. The alkenylene group or alkynylene group may be linear, branched or cyclic, which may be optionally substituted with one or more substituents.

The term aryl group or arylene group herein may mean, unless otherwise specified, a monovalent residue or divalent residue derived from a compound comprising one benzene structure, or a structure in which two or more benzene rings are linked while sharing one or two carbon atoms, or linked by any linker, or a derivative thereof. The aryl group or arylene group may be, for example, an aryl group having 6 to 30 carbon atoms, 6 to 25 carbon atoms, 6 to 21 carbon atoms, 6 to 18 carbon atoms or 6 to 13 carbon atoms, unless otherwise specified.

In the present application, the term aromatic structure may mean the aryl group or arylene group.

In this specification, the term alicyclic ring structure means a cyclic hydrocarbon structure other than an aromatic ring structure, unless otherwise specified. The alicyclic ring structure may be, for example, an alicyclic ring structure having 3 to 30 carbon atoms, 3 to 25 carbon atoms, 3 to 21 carbon atoms, 3 to 18 carbon atoms or 3 to 13 carbon atoms, unless otherwise specified.

In the present application, the term single bond may mean a case where no separate atom is present at the relevant site. For example, in the structure represented by A-B-C, when B is a single bond, no separate atom exists at the site represented by B, and A and C are directly connected, so that it may mean to form a structure represented by A-C.

In the present application, the substituent, with which the alkyl group, alkenyl group, alkynyl group, alkylene group, alkenylene group, alkynylene group, alkoxy group, aryl group, arylene group, chain or aromatic structure, and the like may be optionally substituted, may be exemplified by a hydroxy group, a halogen atom, a carboxyl group, a glycidyl group, an acryloyl group, a methacryloyl group, an acryloyloxy group, a methacryloyloxy group, a thiol group, an alkyl group, an alkenyl group, an alkynyl group, an alkylene group, an alkenylene group, an alkynylene group, an alkoxy group or an aryl group, and the like, but is not limited thereto.

In one aspect of the present application, the block copolymer may comprise a polymer segment comprising a unit of Formula 1 below. Here, the polymer segment may be referred to as a segment A. The polymer segment A may comprise a unit of Formula 4 below as a main component. In this specification, the fact that a polymer segment comprises a certain unit as a main component means a case where the relevant polymer segment comprises the unit 60% or more, 65% or more, 70% or more, 75% or more, 80% or more, 85% or more, or 90% or more, and comprises it 100% or less, by weight.

[Formula 1]

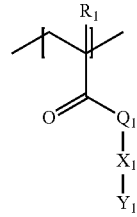

In Formula 1, $R_1$ is hydrogen or an alkyl group having 1 to 4 carbon atoms, $Q_1$ is a single bond, —O-$L_1$-C(=O)— or —O-$L_1$-, $X_1$ is —N($R_2$)-$L_2$-C(=O)—O—, O—C(=O)—, —C(=O)—O—, a urethane linker or a urea linker, where $L_1$ is an alkylene group having 1 to 4 carbon atoms, $L_2$ is an alkylene group having 1 to 4 carbon atoms or an alkylidene group having 2 to 4 carbon atoms and $R_2$ is hydrogen or an alkyl group having 1 to 4 carbon atoms, and $Y_1$ is a linear chain having 4 or more chain-forming atoms.

In one example of the present application, the unit of Formula 1 may be a unit in which $R_1$ is hydrogen or an alkyl group having 1 to 4 carbon atoms, for example, a methyl group, $Q_1$ is a single bond or —O-$L_1$-C(=O)—, $X_1$ is —N($R_2$)-$L_2$-C(=O)—O—, where $L_1$ is a linear alkylene group having 1 to 4 carbon atoms, $L_2$ is a methylene group or an ethylidene group and $R_2$ is hydrogen, and $Y_1$ is a linear chain having 4 or more chain-forming atoms.

In one example of the present application, the unit of Formula 1 may be a unit in which $R_1$ is hydrogen or an alkyl group having 1 to 4 carbon atoms, $Q_1$ is —O-$L_1$-, $X_1$ is —O—C(=O)—, —C(=O)—O—, a urethane linker or a urea linker, where $L_1$ is a linear alkylene group having 1 to 4 carbon atoms, and $Y_1$ is a linear chain having 4 or more chain-forming atoms.

In Formula 1, $Y_1$ comprises a chain structure formed by at least four chain-forming atoms.

In the present application, the term chain-forming atom means an atom forming a linear structure of a predetermined chain. The chain may be linear, or may be branched, but the number of chain-forming atoms is calculated by only the number of atoms forming the longest straight chain, where other atoms bonded to the chain-forming atoms (for example, when the chain-forming atom is a carbon atom, hydrogen atoms bonding to the carbon atom, etc.) are not calculated. In the case of a branched chain, the number of chain-forming atoms can be calculated as the number of chain-forming atoms forming the longest chain. For example, when the chain is an n-pentyl group, all of the chain-forming atoms are carbon, the number thereof is 5, and even if the chain is a 2-methylpentyl group, all of the chain-forming atoms are carbon, and the number thereof is 5. The chain-forming atom may be exemplified by carbon, oxygen, sulfur or nitrogen, and the like, and the appropriate chain-forming atom may be carbon, oxygen or nitrogen, or may be carbon or oxygen. The number of chain-forming atoms may be 5 or more, 6 or more, 7 or more, 8 or more, 9 or more, 10 or more, 11 or more, or 12 or more. The number of the chain-forming atoms may be 30 or less, 25 or less, 20 or less, or 16 or less.

When the compound of Formula 1 has formed a block copolymer to be described below, it may allow the block copolymer to exhibit excellent self-assembly properties due to the presence of the chain.

In one example, the chain may be a linear hydrocarbon chain such as a linear alkyl group. In this case, the alkyl group may be an alkyl group having 8 or more carbon atoms, 8 to 30 carbon atoms, 8 to 25 carbon atoms, 8 to 20 carbon atoms, or 8 to 16 carbon atoms. One or more of the carbon atoms in the alkyl group may optionally be substituted with an oxygen atom, and at least one hydrogen atom of the alkyl group may be optionally substituted by another substituent.

The block copolymer comprises, together with the polymer segment A, polymer segment B different from the polymer segment A.

In the present application, the fact that two kinds of polymer segments are identical means any one case of cases in which in any two kinds of polymer segments the kinds of monomer units contained as the main component are identical to each other, or 50% or more, 55% or more, 60% or more, 65% or more, 70% or more, 75% or more, 80% or more, 85% or more or 90% or more of monomer unit kinds contained in two kinds of polymer segments are common and a weight ratio deviation of the common monomer units in each polymer segment is within 30%, within 25%, within 20%, within 20%, within 15%, within 10% or within 5%. If both polymer segments do not satisfy the two cases, they are polymer segments that are different from each other. Here, it may be proper that the ratio of the common monomer units is satisfied for both polymer segments. For example, if any polymer segment 1 has monomer units of A, B, C, D and F and the other polymer segment 2 has monomer units of D, F, G and H, then the common monomer units in polymer segments 1 and 2 are D and F, where in the position of polymer segment 1 the common ratio is 40% (=100×2/5) because two kinds of the total five kinds are common, but in the position of polymer segment 2 the ratio is 50% (=100× 2/5). Thus, in this case, both polymer segments may be regarded as not identical because the common ratio is not less than 50% only in polymer segment 2. On the other hand, the weight ratio deviation of the common monomers is a percentage of a numerical value in which a large weight ratio minus a small weight ratio is divided by the small weight ratio. For example, in the above case, if the weight ratio of the D monomer units in the segment 1 is about 40% based on 100% of the total weight ratio of the whole monomer units in the segment 1 and the weight ratio of the D monomer units in the segment 2 is about 30% based on 100% of the total weight ratio of the whole monomer units in the segment 2, the weight ratio deviation may be about 33% (=100×(40−30)/30) or so. If the common monomer units are two or more kinds in two segments, in order to be the same segment, it can be considered as the common monomers when the weight ratio deviation within 30% is satisfied for all the common monomers or for the monomer unit as the main component. Each polymer segment that is recognized as the same by the above criteria may be a different type of polymer (e.g., any one segment is in the form of a block copolymer and the other segment is in the form of a random copolymer), but it may be, suitably, the same type of polymer.

The block copolymer of the present application may be in a form of a diblock copolymer in which the polymer segment B is connected to one end of the polymer segment A as above. If necessary, the block copolymer may also be implemented as a multi-block copolymer having two or more blocks, by comprising additional segments.

In the present application, the specific kind of the polymer segment B is not particularly limited.

For example, the polymer segment B may be a polyvinyl pyrrolidone polymer segment, a polylactic acid polymer segment, a polyvinyl pyridine polymer segment, a polyalkyl (meth)acrylate segment such as polymethyl methacrylate, a polystyrene polymer segment such as polystyrene or poly-trimethylsilylstyrene, a polyalkylene oxide polymer segment such as polyethylene oxide, a polybutadiene polymer segment, a polyisoprene polymer segment or a polyolefin polymer segment such as polyethylene. Such a polymer segment may be referred to as a polymer segment 2A herein.

In another example, the polymer segment B may be a polymer segment having an aromatic structure comprising one or more halogen atoms.

Such a polymer segment B may be, for example, a polymer segment comprising a unit represented by Formula 7 below. The polymer segment may comprise the unit of Formula 7 as a main component. Such a polymer segment may be referred to as a polymer segment 2B herein.

[Formula 7]

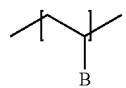

In Formula 7, B is a monovalent substituent having an aromatic structure comprising one or more halogen atoms.

When such a polymer segment B is present on at least one side of the above-mentioned polymer segment A, the block copolymer can exhibit excellent self-assembly properties and the like.

In Formula 7, the aromatic structure may be, for example, an aromatic structure having 6 to 18 carbon atoms or 6 to 12 carbon atoms.

Also, as the halogen atom contained in Formula 7, a fluorine atom or a chlorine atom can be exemplified, and appropriately, a fluorine atom can be used, without being limited thereto.

In one example, B in Formula 7 may be a monovalent substituent having an aromatic structure with 6 to 12 carbon atoms, substituted with 1 or more, 2 or more, 3 or more, 4 or more, or 5 or more halogen atoms. The upper limit of the number of halogen atoms is not particularly limited, where for example, 10 or less, 9 or less, 8 or less, 7 or less, or 6 or less halogen atoms may be present therein.

For example, Formula 7, which is the unit, contained in the polymer segment 2B may be represented by Formula 8 below.

[Formula 8]

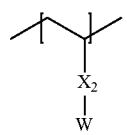

In Formula 8, $X_2$ is a single bond, an oxygen atom, a sulfur atom, —S(=O)$_2$—, an alkylene group, an alkenylene group, an alkynylene group, —C(=O)—$X_1$— or —$X_1$—C(=O)—, where $X_1$ is a single bond, an oxygen atom, a sulfur atom, —S(=O)$_2$—, an alkylene group, an alkenylene group or an alkynylene group, and W is an aryl group containing at least one halogen atom. Here, W may be an aryl group substituted with at least one halogen atom, for example, an aryl group having 6 to 12 carbon atoms, substituted with 2 or more, 3 or more, 4 or more, or 5 or more halogen atoms.

The unit contained in the polymer segment 2B may be represented, for example, by Formula 9 below.

[Formula 9]

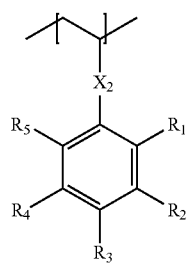

In Formula 9, $X_2$ is a single bond, an oxygen atom, a sulfur atom, —S(=O)$_2$—, an alkylene group, an alkenylene group, an alkynylene group, —C(=O)—$X_1$— or —$X_1$—C(=O)—, where $X_1$ is a single bond, an oxygen atom, a sulfur atom, —S(=O)$_2$—, an alkylene group, an alkenylene group or an alkynylene group, $R_1$ to $R_5$ are each independently hydrogen, an alkyl group, a haloalkyl group or a halogen atom, and the number of halogen atoms contained in $R_1$ to $R_5$ is 1 or more.

In another example, $X_2$ in Formula 9 may be a single bond, an oxygen atom, an alkylene group, —C(=O)—O— or —O—C(=O)—.

In Formula 9, $R_1$ to $R_5$ may be each independently hydrogen, an alkyl group haloalkyl group or a halogen atom, but $R_1$ to $R_5$ may comprise 1 or more, 2 or more, 3 or more, 4 or more, or 5 or more halogen atoms, for example, fluorine atoms. The halogen atoms, for example, fluorine atoms contained in $R_1$ to $R_5$ may be 10 or less, 9 or less, 8 or less, 7 or less, or 6 or less.

Such a block copolymer of the present application can exhibit excellent phase separation or self-assembly properties basically.

In such a block copolymer, the volume fraction of the polymer segment A may be in a range of 0.10 to 0.90, and the sum of the volume fractions of the polymer segments A and B may be 1. The block copolymer containing each polymer segment at such a volume fraction can exhibit excellent self-assembly properties. The volume fraction of each polymer segment of the block copolymer can be determined based on the density and the molecular weight measured by GPC (gel permeation chromatography) or NMR (nuclear magnetic resonance), of each polymer segment.

The block copolymer may have a number average molecular weight (Mn) in a range of, for example, 3,000 to 300,000. In this specification, the term number average molecular weight is a converted value for standard polystyrene measured using GPC (gel permeation chromatograph), and the term molecular weight herein means a number average molecular weight, unless otherwise specified. In another example, the molecular weight (Mn) may be, for example, 3000 or more, 5000 or more, 7000 or more, 9000 or more, 11000 or more, 13000 or more, or 15000 or more. In another example, the molecular weight (Mn) may be 250,000 or less, 200,000 or less, 180,000 or less, 160,000 or less, 140000 or less, 120000 or less, 100000 or less, 90000 or less, 80000 or less, 70000 or less, 60000 or less, 50000 or less, 40000 or less, 30000 or less, or 25000 or less. The block copolymer may have a polydispersity (Mw/Mn) in a range of 1.01 to 1.60. In another example, the polydispersity may be about 1.1 or more, about 1.2 or more, about 1.3 or more, or about 1.4 or more.

In this range, the block copolymer may exhibit proper self-assembly properties. The number average molecular weight of the block copolymer or the like can be adjusted in consideration of the desired self-assembled structure and the like.

When the block copolymer comprises at least the polymer segments A and B, the ratio of the polymer segment A, for example, the polymer segment comprising the chain as described above, in the block copolymer may be in a range of 10 mol % to 90 mol %.

Such a block copolymer can be prepared in a known manner. For example, the block copolymer can be produced by a CLP (Controlled/Living Radical Polymerization) method using monomers forming units of each polymer segment. For example, there are anionic polymerization in which the block copolymer is synthesized in the presence of an inorganic acid salt such as an alkali metal or an alkali earth metal by using an organic rare earth metal complex as a polymerization initiator or by using an organic alkali metal compound as a polymerization initiator, an anionic polymerization method in which the block copolymer is synthesized in the presence of an organic aluminum compound by using an organic alkali metal compound as a polymerization initiator, an atom transfer radical polymerization method (ATRP) using an atom transfer radical polymerization agent as a polymerization inhibitor, an ARGET (Activators Regenerated by Electron Transfer) atom transfer radical polymerization method (ATRP), which uses an atom transfer radical polymerization agent as a polymerization initiator, but performs polymerization under an organic or inorganic reducing agent that generates electrons, an ICAR (Initiators for Continuous Activator Regeneration) atom transfer radical polymerization method (ATRP), a polymerization method by reversible addition-fragmentation chain transfer (RAFT) using an inorganic reducing agent and a reversible addition-fragmentation chain transfer agent or a method of using an organotellurium compound as an initiator, and the like, and a suitable method may be selected among these methods and applied.

For example, the block copolymer can be prepared in a manner comprising polymerizing a reactant comprising monomers capable of forming the polymer segments in the presence of a radical initiator and a living radical polymerization reagent by a living radical polymerization method.

The method of forming other polymer segments included in the copolymer together with the polymer segment formed by using the monomer upon producing the block copolymer is not particularly limited, where a suitable monomer may be selected in consideration of the kind of the desired polymer segment, thereby forming the other polymer segments.

The process of producing the polymer segment copolymer may further comprise, for example, a process of precipitating the polymerization product produced through the above processes in a non-solvent.

The kind of the radical initiator is not particularly limited, which may be appropriately selected in consideration of polymerization efficiency, and for example, an azo compound such as AIBN (azobisisobutyronitrile) or 2,2'-azobis-(2,4-dimethylvaleronitrile), or peroxide series such as BPO (benzoyl peroxide) or DTBP (di-t-butyl peroxide) may be used.

The living radical polymerization process may be performed in a solvent such as, for example, methylene chloride, 1,2-dichloroethane, chlorobenzene, dichlorobenzene, benzene, toluene, acetone, chloroform, tetrahydrofuran, dioxane, monoglyme, diglyme, dimethylformamide, dimethylsulfoxide or dimethylacetamide.

As the non-solvent, an alcohol such as methanol, ethanol, normal propanol or isopropanol, a glycol such as ethylene glycol, n-hexane, cyclohexane, n-heptane or ether series such as petroleum ether can be used, without being limited thereto.

The present application also relates to a polymer film comprising the block copolymer. The polymer film may be used for various applications, and for example, may be used for various electric or electronic elements, a process of forming the pattern, a recording medium such as a magnetic storage medium and a flash memory, or a biosensor, and the like.

In one example, the block copolymer in the polymer film may implement a periodic structure including a sphere, a cylinder, a gyroid, a lamella, or the like through self-assembly.

For example, the polymer segments A to C in the block copolymer or another segment in the segments of the other segments covalently bonded thereto may form a regular structure such as a lamellar shape or a cylinder shape.

The present application also relates to a method for forming a polymer film using the block copolymer. The method may comprise forming a polymer film comprising the block copolymer in a self-assembled state on a substrate. For example, the method may comprise a process of forming a layer of the block copolymer or a coating liquid in which the block copolymer is diluted in an appropriate solvent on the substrate by application or the like, and, if necessary, annealing or heat-treating the layer.

The annealing or heat treatment may be performed based on, for example, the phase transition temperature or the glass transition temperature of the block copolymer, and may be performed at, for example, a temperature above the glass transition temperature or the phase transition temperature. The time for which this heat treatment is performed is not particularly limited, and the treatment can be performed within a range of, for example, about 1 minute to 72 hours, but the time can be changed as needed. The heat treatment temperature of the polymer thin film may be, for example, about 100° C. to 250° C., but this may be changed in consideration of the block copolymer to be used.

In another example, the formed layer may also be subjected to solvent annealing in a non-polar solvent and/or a polar solvent at room temperature for about 1 minute to 72 hours.

The present application also relates to a patterning method. For example, the method may comprise a process of selectively removing polymer segments A, B and/or C of the block copolymer from a laminate having a substrate, and the polymer film formed on the surface of the substrate and comprising the self-assembled block copolymer. The method may be a method of forming a pattern on the substrate. For example, the method may comprise forming a polymer film comprising the block copolymer on a substrate, selectively removing one or more polymer segments of the block copolymer present in the film, and then etching the substrate. In this way, it is possible to form, for example, a nanoscale fine pattern. In addition, various types of patterns such as nano-rods or nano-holes can be formed through the above-described method depending on the shape of the block copolymer in the polymer film. If necessary, a copolymer different from the block copolymer or a homopolymer, and the like may be mixed for pattern formation. The type of the substrate to be applied to this method is not particularly limited and may be selected as needed, and for example, silicon oxide or the like may be applied.

For example, the method can form a nanoscale pattern of silicon oxide exhibiting a high aspect ratio. For example, after forming the polymer film on silicon oxide and selectively removing any one polymer segment of the block copolymer in a state where the block copolymer in the polymer film forms a predetermined structure, the silicon oxide may be etched by various ways, for example, reactive ion etching or the like to realize various shapes including patterns of nano-rods or nano-holes, and the like. In addition, a nanopattern having a large aspect ratio can be realized through such a method.

For example, the pattern can be implemented on a scale of several tens of nanometers, and such a pattern can be utilized for various applications including, for example, a next generation information electronic magnetic recording medium and the like.

The method of selectively removing any one polymer segment of the block copolymer in the above method is not particularly limited, and for example, a method of removing a relatively soft polymer segment by irradiating the polymer film with an appropriate electromagnetic wave, for example, ultraviolet or the like, can be used. In this case, the ultraviolet irradiation condition is determined according to the type of the polymer segment of the block copolymer, and the method can be performed, for example, by being irradiated with ultraviolet having a wavelength of about 254 nm for 1 minute to 60 minutes.

Also, following the ultraviolet irradiation, a step of treating the polymer film with an acid or the like to further remove the segment decomposed by ultraviolet may also be performed.

Furthermore, the step of etching the substrate using the polymer film in which the polymer segments are selectively removed as a mask is not particularly limited, which may be performed, for example, through a reactive ion etching step using $CF_4/Ar$ ions or the like and following this process, a step of removing the polymer film from the substrate by an oxygen plasma treatment or the like may also be performed.

Advantageous Effects

The present application may provide a block copolymer and a use thereof. The block copolymer of the present application has excellent self-assembly properties or phase separation characteristics, to which various functions to be required can also be freely imparted.

BRIEF DESCRIPTION OF DRAWINGS

FIGS. 1 to 3 are photographs of self-assembled films formed by block copolymers.

FIGS. 4 to 6 are views comparing etching selectivity.

MODE FOR INVENTION

Hereinafter, the present application will be described in detail by way of examples according to the present application and comparative examples, but the scope of the present application is not limited by the following examples.

1. NMR Measurement

NMR analyses were performed at room temperature using an NMR spectrometer including a Varian Unity Inova (500 MHz) spectrometer with a triple resonance 5 mm probe. The analytes were diluted in a solvent for NMR measurement ($CDCl_3$) to a concentration of about 10 mg/ml, and chemical shifts were expressed in ppm.

<Application Abbreviation> br=broad signal, s=singlet, d=doublet, dd=double doublet, t=triplet, dt=double triplet, q=quartet, p=quintet, m=multiplet.

2. GPC (Gel Permeation Chromatograph)

The number average molecular weight (Mn) and the molecular weight distribution were measured using GPC (gel permeation chromatography). Into a 5 mL vial, an analyte such as block copolymers of Examples or Comparative Examples or a giant initiator is put and diluted in THF (tetrahydrofuran) to a concentration of about 1 mg/mL or so. Then, a standard sample for calibration and a sample to be analyzed were filtered through a syringe filter (pore size: 0.45 μm) and then measured. As the analytical program, ChemStation from Agilent Technologies was used, and the elution time of the sample was compared with the calibration curve to obtain the weight average molecular weight (Mw) and the number average molecular weight (Mn), respectively, and the molecular weight distribution (PDI) was calculated by the ratio (Mw/Mn) thereof. The measurement conditions of GPC are as follows.

<GPC Measurement Condition>

Instrument: 1200 series from Agilent Technologies

Column: using two PLgel mixed B from Polymer Laboratories

Solvent: THF

Column temperature: 35

Sample concentration: 1 mg/mL, 200 L injection

Standard samples: polystyrene (Mp: 3900000, 723000, 316500, 52200, 31400, 7200, 3940, 485)

Preparation Example 1

A compound of Formula A below was synthesized in the following manner. Boc-glycine (10.0 g, 57.1 mmol) and 1-dodecanol (11.5 g, 68.5 mmol) were placed in a flask, dissolved in methylene chloride (MC) (300 mL), and then DCC (N,N'-dicylcohexylcarbodiimide) (14.4 g, 68.5 mmol) and DMAP (p-dimethylaminopyridine) (2.8 g, 22.8 mmol) were added thereto in this order. The mixture was stirred at room temperature and reacted overnight, and then filtered to remove solids. The remaining solution was collected and subjected to column with an EA (ethyl acetate)/hexane solution (EA:hexane=1:5) to obtain a colorless liquid intermediate A1 (14.3 g, 45.3 mmol).

<NMR Analysis Result>

$^1$H-NMR (CDCl3): d5.00 (s, 1H); d4.13 (t, 2H); δ3.90 (d, 2H); d1.63 (tt, 2H); d1.45 (s, 9H); d1.37-1.22 (m, 18H); d0.88 (t, 3H)

The intermediate A1 (14.3 g, 45.3 mmol) was placed in a flask, dissolved in 1,4-dioxane (120 mL), and then a solution of hydrochloric acid (4N in 1,4-dioxane, 60 mL) was added thereto with stirring in an ice bath and the mixture was reacted overnight at room temperature. An excess amount of MC was added to the reaction solution, filtered and the solid was washed several times with MC to obtain a white solid intermediate A2 (8.7 g, 34.7 mmol), which was dried in a vacuum oven, and then the next reaction was performed.

The intermediate A2 (8.7 g, 34.7 mmol) was placed in a flask, MC (150 mL) was added thereto and the mixture was dispersed with vigorous stirring. In an ice bath, TEA (tetraethylammonium) (10.5 g, 104.1 mmol) is slowly added thereto, and if the reactants are well mixed, then methacryloyl chloride (4.0 g, 49.5 mmol) is added slowly thereto. The flask was taken out at room temperature, and the mixture was reacted overnight and subjected to column with a mixed solution of EA/hexane to obtain a target product (Formula A below) in a gray solid phase.

<NMR Analysis Result>

$^1$H-NMR ($CDCl_3$): d6.31 (s, 1H); d5.77 (s, 2H); δ5.39 (s, 1H); d4.16 (t, 2H); d4.10 (d, 2H); d1.99 (s, 3H), d1.65 (tt, 2H), d1.37-1.22 (m, 18H); d0.88 (t, 3H)

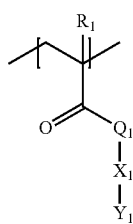

[Formula A]

In Formula A, R$_1$ is methyl, Q$_1$ is a single bond, X$_1$ is —N(R$_2$)-L$_2$-C(=O)—O—, L$_2$ is methylene, R$_2$ is hydrogen, and Y$_1$ is a dodecyl group.

Preparation Example 2

A compound of Formula B below was synthesized in the following manner. Boc-glycine (10.0 g, 57.1 mmol) and 1-dodecanol (11.5 g, 68.5 mmol) were placed in a flask, dissolved in methylene chloride (MC) (300 mL), and then DCC (N,N'-dicylcohexylcarbodiimide) (14.4 g, 68.5 mmol) and DMAP (p-dimethylaminopyridine) (2.8 g, 22.8 mmol) were added thereto in this order. The mixture was stirred at room temperature and reacted overnight, and then filtered to remove solids. The remaining solution was collected and subjected to column with an EA (ethyl acetate)/hexane solution (EA:hexane=1:5) to obtain a colorless liquid intermediate B1. The intermediate B1 was placed in a flask, dissolved in 1,4-dioxane (120 mL), and then a solution of hydrochloric acid (4N in 1,4-dioxane, 60 mL) was added thereto while stirring in an ice bath and the mixture was reacted overnight at room temperature. An excess amount of MC was added to the reaction solution, filtered and the solid was washed several times with MC to obtain a white solid intermediate B2 (13.0 g, 46.5 mmol), which was dried in a vacuum oven, and then the next reaction was performed.

<NMR Analysis Result>
$^1$H-NMR (DMSO-d$_6$): d8.44 (s, 3H); d4.13 (t, 2H); δ3.76 (s, 2H); d1.58 (tt, 2H); d1.30-1.23 (m, 18H); d0.88 (t, 3H)

The intermediate B2 (13.0 g, 46.5 mmol) was placed in a flask, MC (150 mL) was added thereto and the mixture was dispersed, and chloroacetyl chloride (10.5 g, 92.9 mmol) was added thereto. In an ice bath, TEA (tetraethylammonium) (14.1 g, 139.4 mmol) was slowly added with stirring and the mixture was reacted overnight at room temperature. After completing the reaction, the solids were removed by a filter, the remaining solution was collected and subjected to column with an EA/hexane (1:5) solution, and the resulting solid was washed with hexane to remove impurities, thereby obtaining a white solid intermediate B3 (11.1 g, 34.7 mmol).

<NMR Analysis Result>
$^1$H-NMR (CDCl$_3$): d7.07 (s, 1H); d4.17 (t, 2H); δ4.09 (s, 2H); d4.08 (d, 2H); d1.65 (tt, 2H); d1.40-1.26 (m, 18H); d0.88 (t, 3H)

The intermediate B3 (11.1 g, 34.7 mmol) and methacrylic acid (12.0 g, 138.8 mmol) are placed in a flask and dissolved in dimethylformamide (DMF) (200 mL) with stirring, and then potassium carbonate (28.8 g, 208.2 mmol) and potassium iodide (0.58 g, 3.48 mmol) are added thereto. The mixture was reacted at 80° C. for 2 hours, an excess amount of water was poured thereto, and the mixture was extracted with diethyl ether. The organic layer was collected and dried by magnesium sulfate, and after removing the solvent, the product was subjected to column to obtain a compound of Formula B below as a white solid phase (11.8 g, 31.9 mmol).

<NMR Analysis Result>
$^1$H-NMR (CDCl$_3$): d6.67 (s, 1H); d6.23 (s, 1H); δ5.71 (s, 1H); d4.70 (s, 2H); d4.17 (t, 2H); d4.09 (d, 2H), d2.02 (s, 3H), d1.65 (tt, 2H). d1.34-1.26 (m, 18H); d0.88 (t, 3H)

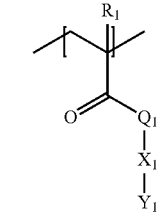

[Formula B]

In Formula B, R$_1$ is methyl, Q$_1$ is —O-L$_1$-C(=O)—, X$_1$ is —N(R$_2$)-L$_2$-C(=O)—O—, where L$_1$ and L$_2$ are each methylene and R$_2$ is hydrogen, and Y$_1$ is a dodecyl group.

Preparation Example 3

A compound (DPM-C12) of Formula C below was synthesized in the following manner. Hydroquinone (10.0 g, 94.2 mmol) and 1-bromododecane (23.5 g, 94.2 mmol) were placed in a 250 mL flask, dissolved in 100 mL of acetonitrile, and then an excess amount of potassium carbonate was added thereto and reacted at 75° C. for about 48 hours under a nitrogen atmosphere. The potassium carbonate remaining after the reaction and the acetonitrile used for the reaction were also removed. A mixed solvent of DCM (dichloromethane) and water was added thereto to work up the mixture, and the separated organic layer was dehydrated with MgSO$_4$. Subsequently, the product was purified by DC (dichloromethane) in CC (column chromatography) to obtain an intermediate in a white solid phase in a yield of about 37%.

<NMR Analysis Result of Intermediate>
$^1$H-NMR (CDCl$_3$): d6.77 (dd, 4H); δd4.45 (s, 1H); d3.89 (t, 2H); d1.75 (p, 2H); d1.43 (p, 2H); d1.33-1.26 (m, 16H); d0.88 (t, 3H).

The synthesized intermediate (9.8 g, 35.2 mmol), methacrylic acid (6.0 g, 69.7 mmol), DCC (dicyclohexylcarbodiimide) (10.8 g, 52.3 mmol) and DMAP (p-dimethylaminopyridine) (1.7 g, 13.9 mmol) were placed in the flask and 120 mL of methylene chloride was added thereto, and then reacted at room temperature for 24 hours in a nitrogen atmosphere. After the reaction, the salt (urea salt) generated during the reaction was filtered off and the remaining methylene chloride was also removed. Impurities were removed using hexane and DCM (dichloromethane) as the mobile phase in CC (column chromatography) and the resulting product was recrystallized in a mixed solvent of methanol and water (mixed at a weight ratio of 1:1) to obtain the target product (DPM-C12) (7.7 g, 22.2 mmol) in a white solid phase in a yield of 63%.

<NMR Analysis Result of DPM-C12>
$^1$H-NMR (CDCl$_3$): d7.02 (dd, 2H); δd6.89 (dd, 2H); d6.32 (dt, 1H); d5.73 (dt, 1H); d3.94 (t, 2H); δd2.05 (dd, 3H); d1.76 (p, 2H); δd1.43 (p, 2H); 1.34-1.27 (m, 16H); d0.88 (t, 3H).

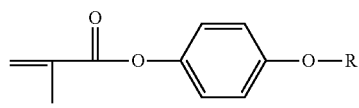

[Formula C]

In Formula C, R is a linear alkyl group having 12 carbon atoms.

Example 1

0.5 g of the compound of Formula A in Preparation Example 1, 2.6 mg of AIBN (azobisisobutyronitrile), 7.1 mg of CPBD (2-cyano-2-propyl benzodithioate) as an RAFT agent (reversible addition-fragmentation chain transfer agent) and 1.172 mL of anisole were placed in a flask and stirred at room temperature for 1 hour under a nitrogen atmosphere, and then an RAFT polymerization was performed in a silicone oil vessel at 70° C. for about 6 hours. After the polymerization, the reaction solution was precipitated twice in 300 mL of methanol, and then filtered under reduced pressure and dried to synthesize a polymer of the compound of Formula A in which the RAFT reagent was bonded to the end thereof as a macro initiator (number average molecular weight Mn: 10,500, molecular weight distribution PDI: 1.20).

In a flask, 0.1768 g of the macro initiator, 1.961 g of pentafluorostyrene, and 2.0 mg of AIBN (azobisisobutyronitrile) were dissolved in 0.716 mL of anisole and stirred at room temperature for 1 hour under a nitrogen atmosphere, and then an RAFT polymerization reaction was performed in a silicone oil vessel at 115° C. for about 4 hours. After the polymerization, the reaction solution was precipitated twice in 250 mL of methanol and then filtered under reduced pressure to prepare a target block copolymer (number average molecular weight Mn: 28,100, molecular weight distribution PDI: 1.16).

Example 2

2 g of the compound of Formula B in Preparation Example 2, 11 mg of AIBN (azobisisobutyronitrile), 29.9 mg of CPBD (2-cyano-2-propyl benzodithioate) as an RAFT agent (reversible addition-fragmentation chain transfer agent) and 8.040 mL of anisole were placed in a flask and stirred at room temperature for 1 hour under a nitrogen atmosphere, and then an RAFT polymerization was performed for about 4 hours. After the polymerization, the reaction solution was precipitated twice in 300 mL of methanol, and then filtered under reduced pressure and dried to synthesize a polymer of the compound of Formula B in which the RAFT reagent was bonded to the end thereof as a macro initiator (number average molecular weight Mn: 14,500, molecular weight distribution PDI: 1.18).

In a flask, 0.35 g of the macro initiator, 2.811 g of pentafluorostyrene, and 2.0 mg of AIBN (azobisisobutyronitrile) were dissolved in 3.176 mL of anisole and stirred at room temperature for 1 hour under a nitrogen atmosphere, and then an RAFT polymerization reaction was performed in a silicone oil vessel at 70° C. for about 6 hours. After the polymerization, the reaction solution was precipitated twice in 250 mL of methanol and then filtered under reduced pressure to prepare a target block copolymer (number average molecular weight Mn: 37,600, molecular weight distribution PDI: 1.27).

Comparative Example 1

2 g of the compound of Formula C in Preparation Example 3, 64 mg of CPBD (2-cyano-2-propyl benzodithioate) as an RAFT agent (reversible addition-fragmentation chain transfer agent), 23 mg of AIBN (azobisisobutyronitrile) and 5.34 mL of anisole were placed in a flask and stirred at room temperature for 1 hour under a nitrogen atmosphere, and then an RAFT polymerization was performed at 70° C. for about 4 hours. After the polymerization, the reaction solution was precipitated in 250 mL of methanol, and then filtered under reduced pressure and dried to synthesize a pink macro initiator (number average molecular weight Mn: 9,000, molecular weight distribution PDI: 1.16).

In a flask, 0.3 g of the macro initiator, 2.7174 g of pentafluorostyrene, and 2.1 mg of AIBN (azobisisobutyronitrile) were dissolved in 1.306 mL of anisole and stirred at room temperature for 30 minutes under a nitrogen atmosphere, and then a polymerization reaction was performed at 115° C. for about 4 hours. After the polymerization, the reaction solution was precipitated in 250 mL of methanol and then filtered under reduced pressure to prepare a pale pink target block copolymer (number average molecular weight Mn: 16,300, molecular weight distribution PDI: 1.13).

Test Example 1

Confirmation of Self-Assembly Pattern

A coating liquid, in which the block copolymers synthesized in Examples 1 and 2 and Comparative Example 1 were each diluted in toluene to an appropriate concentration, was coated on a silicon wafer substrate at a speed of 3000 rpm for 60 seconds by using a spin coater to form a polymer thin film. Such a thin film was heat-treated at 220° C. for 1 hour to express a nanostructure on the surface of the thin film. FIGS. 1 and 2 are images of self-assembly patterns expressed for Examples 1 and 2, respectively, and FIG. 3 is an image of self-assembly patterns expressed for Comparative Example 1.

Test Example 2

Confirmation of Etching Selectivity

The etching selectivity of the block copolymers of Examples 1 and 2 and Comparative Example 1 was evaluated. The etching selectivity was evaluated by preparing the respective blocks of each block copolymer of Examples 1 and 2 and Comparative Example 1 in a homopolymer form, forming a polymer film with the homopolymer, and then comparing the remaining thickness of the polymer film for each etching time while performing the etching under the same condition (RF power 25 W, pressure 10 mTorr) using an etching apparatus (Plasmalab system 100). FIGS. 4 to 6 show the results, and in FIGS. 4 to 6, the X-axis is the etching time and the Y-axis is the remaining thickness of the polymer film. The initial thickness of all polymer films was controlled to about 100 nm. Referring to FIG. 4, the etching rates of the homopolymer (Polymer A) of the compound of Formula A and the homopolymer film (PPFS) of PFS (pentafluorostyrene) are compared, and in FIG. 5, the etching rates of the homopolymer (Polymer B) of the compound of Formula B and the homopolymer film (PPFS) of PFS (pentafluorostyrene) are compared, and in FIG. 6, the etching rates of the homopolymer (Polymer C) of the compound of Formula C and the homopolymer film (PPFS) of PFS (pentafluorostyrene) are compared. It can be confirmed from the drawings that the etching rate of each block in the block polymers of Examples varies greatly over the etching time, but in the case of Comparative Example 1, no great difference in the etching rate occurs according to the etching time.

The invention claimed is:

1. A block copolymer comprising a polymer segment A having a unit represented by Formula 1 below and a polymer segment B having a unit represented by Formula 9 below:

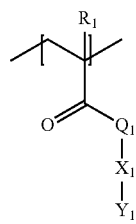

[Formula 1]

in Formula 1, $R_1$ is hydrogen or an alkyl group having 1 to 4 carbon atoms, $Q_1$ is a single bond, —O-$L_1$-C(=O)— or —O-$L_1$-, $X_1$ is —N($R_2$)-$L_2$-C(=O)—O—, O—C(=O)—, —C(=O)—O—, a urethane linker or a urea linker, where $L_1$ is an alkylene group having 1 to 4 carbon atoms, $L_2$ is an alkylene group having 1 to 4 carbon atoms or an alkylidene group having 2 to 4 carbon atoms and $R_2$ is hydrogen or an alkyl group having 1 to 4 carbon atoms, and $Y_1$ is a linear hydrocarbon chain having 8 to 20 chain-forming atoms, wherein at least one carbon atom is optionally replaced with an oxygen, nitrogen or sulfur, and at least one hydrogen atom is optionally substituted with a substituent that is not a halogen atom;

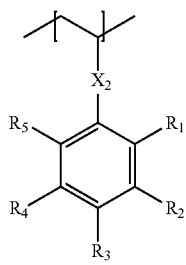

[Formula 9]

in Formula 9, $X_2$ is a single bond, an oxygen atom, a sulfur atom, —S(=O)$_2$—, an alkylene group, an alkenylene group, an alkynylene group, —C(=O)—$X_1$— or —$X_1$—C(=O)—, where $X_1$ is a single bond, an oxygen atom, a sulfur atom, —S(=O)$_2$—, an alkylene group, an alkenylene group or an alkynylene group, $R_1$ to $R_5$ are each independently hydrogen, an alkyl group, a haloalkyl group or a halogen atom, and the number of the halogen atoms contained in $R_1$ to $R_5$ is 1 or more.

2. The block copolymer according to claim 1, wherein the block copolymer is in a diblock form containing only the polymer segments A and B as the polymer segments.

3. The block copolymer according to claim 2, wherein the polymer segment B is connected to one end of the polymer segment A.

4. The block copolymer according to claim 1, wherein in Formula 1, $R_1$ is hydrogen or an alkyl group having 1 to 4 carbon atoms, $Q_1$ is a single bond or —O-$L_1$-C(=O)—, and $X_1$ is —N($R_2$)-$L_2$-C(=O)—O—, where $L_1$ is a linear alkylene group having 1 to 4 carbon atoms, $L_2$ is a methylene group or an ethylidene group and $R_2$ is hydrogen.

5. The block copolymer according to claim 1, wherein in Formula 1, $R_1$ is hydrogen or an alkyl group having 1 to 4 carbon atoms, $Q_1$ is —O-$L_1$-, and $X_1$ is —O—C(=O)—, —C(=O)—O—, a urethane linker or a urea linker, where $L_1$ is a linear alkylene group having 1 to 4 carbon atoms.

6. The block copolymer according to claim 1, wherein each of the chain-forming atoms is independently carbon, oxygen, nitrogen or sulfur.

7. The block copolymer according to claim 1, wherein each of the chain-forming atoms is independently carbon or oxygen.

8. The block copolymer according to claim 1, wherein in Formula 9, $X_2$ is a single bond, an oxygen atom, a sulfur atom or —S(=O)$_2$— and $R_1$ to $R_5$ are each a halogen atom.

9. The block copolymer according to claim 1, wherein in Formula 9, the halogen atom is a fluorine atom.

10. The block copolymer according to claim 1, wherein the sum of volume fraction of the polymer segment A and volume fraction of the polymer segment B is 1, and the volume fraction of the polymer segment A is in a range of 0.10 to 0.90.

11. The block copolymer according to claim 1, wherein in Formula 9, $X_2$ is a single bond, an oxygen atom, an alkylene group, —C(=O)—O— or —O—C(=O)—.

12. The block copolymer according to claim 1, wherein in Formula 9, the number of halogen atoms contained in $R_1$ to $R_5$ is 5 or more.

13. The block copolymer according to claim 1, wherein the block copolymer has a number average molecular weight (Mn) in a range of 3,000 to 300,000.

14. The block copolymer according to claim 1, wherein the block copolymer has a polydispersity (Mw/Mn) in a range of 1.01 to 1.60.

15. A method for forming a polymer film, comprising forming on a substrate a polymer film comprising a self-assembled structure of the block copolymer of claim 1.

16. A patterning method comprising a process of selectively removing any one of polymer segments of a self-assembled structure of the block copolymer of claim 1 from a laminate having a substrate and a polymer film which is formed on the substrate and comprises the block copolymer.

* * * * *